United States Patent [19]
Booth et al.

[11] Patent Number: 5,341,017
[45] Date of Patent: Aug. 23, 1994

[54] SEMICONDUCTOR SWITCH GEOMETRY WITH ELECTRIC FIELD SHAPING

[75] Inventors: Rex Booth; Michael D. Pocha, both of Livermore, Calif.

[73] Assignee: The United States of America as represented by the United States Department of Energy, Washington, D.C.

[21] Appl. No.: 72,310

[22] Filed: Jun. 9, 1993

[51] Int. Cl.⁵ .................................. H01L 23/48
[52] U.S. Cl. .......................... 257/459; 257/465; 257/620; 257/625
[58] Field of Search ............. 257/95, 459, 465, 618, 257/622, 623, 624, 625, 620

[56] References Cited

U.S. PATENT DOCUMENTS

| | | | |
|---|---|---|---|
| 2,861,229 | 11/1958 | Pankove | 257/465 X |
| 3,150,999 | 9/1964 | Rudenberg et al. | 257/465 X |
| 3,158,746 | 11/1964 | Lehovec | 257/465 X |
| 3,170,067 | 2/1965 | Kibler | 257/459 X |
| 3,582,830 | 6/1971 | Pultorak | 257/1 X |
| 4,023,196 | 5/1977 | Kataoka et al. | 357/57 |
| 4,376,285 | 3/1983 | Leonberger et al. | 357/17 |
| 4,839,510 | 8/1989 | Okabe et al. | 250/211 J |
| 4,926,228 | 5/1990 | Ashley et al. | 357/30 |

*Primary Examiner*—William Mintel
*Attorney, Agent, or Firm*—Henry P. Sartorio; Roger S. Gaither; William R. Moser

[57] ABSTRACT

An optoelectric switch is disclosed that utilizes a cylindrically shaped and contoured GaAs medium or other optically active semiconductor medium to couple two cylindrically shaped metal conductors with flat and flared termination points each having an ovoid prominence centrally extending there from. Coupling the truncated ovoid prominence of each conductor with the cylindrically shaped optically active semiconductor causes the semiconductor to cylindrically taper to a triple junction circular line at the base of each prominence where the metal conductor conjoins with the semiconductor and a third medium such as epoxy or air. Tapering the semiconductor at the triple junction inhibits carrier formation and injection at the triple junction and thereby enables greater current carrying capacity through and greater sensitivity of the bulk area of the optically active medium.

18 Claims, 7 Drawing Sheets

SEMICONDUCTOR SWITCH GEOMETRY WITH ELECTRIC FIELD SHAPING

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention lies in the disciplines of electronics, electromagnetic theory, and solid state physics. More specifically, the invention lies in the realm of photoconductive electronic switch devices, and in particular, discloses a preferred geometry or physical orientation of a photoconductive semiconductor medium, GaAs, coupled between two metallic contacts in a manner to obtain maximum electronic field concentration therebetween for maximum electron-hole generation and current flow in the semiconductor bulk area and away from multiple dielectric junction areas to yield a high power, fast, and low rise time switch of increased sensitivity.

2. Description Of Related Art

Until recently, pulser circuit generation of kilovolt level pulses with rise times in the 50 to 200 picosecond range and trigger time jitter in the range of less than 20 picoseconds was virtually impossible to accomplish. With the advent of avalanche diodes and transistors, pulser circuits operating in the above range became a reality; however, such pulser circuits have been somewhat complicated and unwieldy to make and use.

A laser triggered DC biased or pulse biased GaAs, optically active semiconductor, switch would be much easier to use, less expensive to make, and would be capable of achieving a much higher voltage level. By implementing such photoconductive switches, less expensive, more reliable, and longer lived pulsers could be achieved.

Photo conductive switches generally use some optically reactive medium disposed between two electrodes. The medium conventionally operates as a resistive barrier to current flow between the two electrodes until illuminated by light. Upon illumination by light, outer electron energy levels of atoms in the medium absorb a sufficient quantum of photon energy to permit orbiting electrons to be sufficiently energized to break free of their respective atoms creating free and independent negatively charged electrons and leaving behind ionized, positively charged atoms or ions. These positively charged ions, referred to as holes in the case of a solid semiconductor, and negatively charged free electrons, in the presence of an electric field, will cause a current to flow with the flow of electrons and holes thereby changing the medium from a good resistor to a good conductor. Briefly, in a photoconductive switch, light generates carriers in the photoreactive medium that effectively changes the medium from an area of high resistance to an area of low resistance. In making such a conduction change quickly, the medium functions like an electrical switch.

Certain photoconductive switches have been implemented in the past. One such device, generally referred to as a spark gap switch, consists of a pair of electrodes disposed in a medium or environment of inert gas such as Nitrogen. Nitrogen, of course, normally acts as an insulator between the electrodes; however, a few seed carriers normally exist in any gaseous state and with light illumination and concomitant photon energy imparted to the gas, their numbers are increased in sufficient quantity to enable generation of a spark across the contacts. When a spark is discharged across the contacts and through the medium, energy in the electrical discharge is imparted to the Nitrogen atoms and molecules causing further and substantial ionization of Nitrogen atoms yielding positive ions and freeing valence level negative electrons. With free mobility of charged particles, the insulator medium of high resistance changes to a conductor medium of low resistance, and in the presence of an electrical field conduction occurs in the manner of a photoconductive switch.

A spark gap photo conductor switch can switch a great deal of current and can react very fast with respect to a rapid pulse rise time, but it carries with it inherent timing error uncertainties with respect to jitter. Jitter is the time between light illumination and the spark gap generation, i.e. the moment of switching and current flow. Jitter in a spark gap switch can be substantial, and therefore, the exactness with which the photoelectric switch is to operate, i.e. to turn on and turn off, can vary a great deal.

Another prior art optically reactive electrical switch is a thyristor. A thyristor is a solid state type switch consisting of multiple layers of PNPN type junctions. Illumination of the PN junction imparts energy to the P and N doped semiconductor layers thereby generating more free electrons and leaving behind positive holes. A PN junction by its nature normally maintains seed carriers and a charge barrier with the alignment of positive holes on the P side and negative electrons on the N side of each PN junction. With the creation of excess electrons and holes by illumination, an overflow of charge occurs yielding a breakdown of each respective and successive charge barrier. The feedback of barrier breakdown to preceding junctions induces creation of even more charge carriers which rapidly creates an avalanche of charge carriers and effectively converts a nonconductive medium into a conductive medium with the flow of electrons and holes.

Photo conductive switch speed is dependent in large part on the existence of seed carriers and the growth of electron-hole pairs, and in a semiconductor, the switch process starts with thousands of electron hole pairs as seed carriers. As a result the thyristor solid state, photoconductive switch does have the advantage of faster switch reaction and decreased jitter, but it also has increased pulse rise time because carriers must travel from junction to junction for the required feedback before other carriers can inject in and multiply to cause the avalanche which changes the medium from a resistive element to a conductive element.

Other variations of solid state photoconductive devices exist in the art such as a photoconductive detector disclosed in Ashley, U.S. Pat. No. 4,926,228, an optical detector disclosed in Okabe, U.S. Pat. No. 4,839,510, and a high speed optoelectric switch disclosed in Leonberger, U.S. Pat. No. 4,376,285.

Ashley discloses an electrode embedded in an optically reactive semiconductor to accumulate carriers in the vicinity of an output; Okabe discloses a photoconductive contact geometry for carrying higher current; and Leonberger discloses electrodes disposed on the surface of a photoreactive semiconductor operating as a switch.

Although these devices utilize similar theoretical applications as the invention disclosed herein, the embodiment, application, and operation of each are such that they neither anticipate nor suggest the present invention. Indeed, none of the prior art has addressed the long standing problems encountered in the need to conduct and accurately switch a high current with low power illumination. In particular, there exists a need for higher concentration of electric lines of force in the bulk, optically active and illuminated portion of the semiconductor for greater electron-hole generation capability which inherently increases the optical switch sensitivity and thereby diminishes the amount illumination needed to activate the switch. In addition, there exists a need to attenuate lines of force at the semiconductor surface and at triple junctions of various media of different dielectric constants to diminish electron hole formation which thereby diminishes the tendency for electrical shorting or arcing at a triple dielectric junction.

The invention disclosed herein is a photoconductive switch that describes a unique geometry of a photoreactive semiconductor disposed between two metallic electrodes in such manner to increase the switch efficiency by concentrating the electric field through a smaller volume and area of the semiconductor than heretofore has been possible. In particular, the invention relates to a method and apparatus for diminishing the number of electric lines of force at the dielectric surface and at the triple junction where the dielectric constant of the semiconductor is caused to mesh with the dielectric constant of the metal contact and the dielectric constant of a third medium such as air or epoxy. Concentrating the electric field in the bulk area of the semiconductor and away from the triple junction is needed to increase switch sensitivity and in certain applications that require extremely high electric fields in the active bulk-switch area and to limit fields and related carrier injection in the triple junction area.

Laser diode triggered Gallium Arsenide (GaAs) photoconductive switches require extremely high electric fields in the active bulk switch area. With a proper GaAs, metal electrode, and dielectric design, the high bulk electric fields can be achieved without carrier injection at the triple junction and any residual carriers injected at the triple junction can easily be avalanche multiplied in the high electric field in the bulk material. Such carrier generation and avalanche multiplication usually prevents the achievement of suitable high enough electric field for DC biased switch devices. This invention indicates a design that prevents or eliminates carrier injection at the triple junction, and eliminates injected carrier multiplication by reducing the electric field along their travel path. The invention allows DC biased devices to be fabricated with extremely high bulk electric fields while concomitantly having very low triple junction fields that will not generate carriers.

By such means, pulse rise time and timing jitter are greatly diminished with the added benefit and need for less illumination power consumption. Switch speed is proportionately and desirably increased by faster electron-hole generation in an area of less illumination due to the effect of the concentrated electric field.

SUMMARY OF THE INVENTION

It is therefore an object of the invention to improve and increase operation characteristics of semiconductor switches used in high voltage pulse generator applications to include DC or pulse biased laser trigger switch devices, avalanche pulse speed-up devices, and photoconductive operated devices.

Still another object is to utilize a unique geometrical configuration of the conductor-semiconductor interface to reduce the electric field at the multiple dielectric junction, i.e. triple junction, to reduce electric field at the junction thereby preventing generation of charge carriers at the junction.

Another object of the invention is to design an opto electric switch device that concentrates the electric field in the bulk area of the optically active semiconductor.

Yet another object is to design a photoconductive switch that permits higher electric fields to be used in the active, bulk material, switch area of the device than exists in the art.

Another object is to design an opto electric switch that has a high electric field in the active bulk area of the semiconductor in order that less illumination is needed to quickly generate sufficient electron-hole pairs to enable avalanche conduction and thereby cause a switching effect.

Another object is to design an opto electric semiconductor switch that diminishes the number of electron-hole pairs generated in a triple junction area of an opto electric switch due to diminished number of electric lines of force therethrough resulting from truncation of the optically active dielectric around the metal contact to a point where dielectric, metal, and a third medium conjoin.

Yet another object is to abate the likelihood of electrical breakdown, arcing or shorting on the dielectric surface or at the triple junction where local electric field profiles result in a higher electric field locally than in the bulk of the semiconductor.

Another object is to design a switch geometry that enables efficient coupling of the switch pulse power to an efficient transmission line system.

Yet another object is to adjust the electric field profiles in an opto electric switch so that the electric field in the bulk of the device is higher than the field at the surface or at the triple junction thereby enabling the benefit of high bulk breakdown in the dielectric.

Still another object is to shape the electric field across the opto electric switch so that the gap between the contacts can be kept at a minimum thereby minimizing the amount of optical energy required to illuminate a smaller volume of active dielectric to switch a higher voltage.

The foregoing and other more advantageous objects, advantages, and features of the invention will become more readily apparent in light of the attached drawing, the following detailed description of a preferred embodiment, and the appended claims.

In the preferred embodiments, an optically active semiconductor such as GaAs is not only placed between two conductor contacts to conventionally function as an optical switch, but also is specifically shaped between the cylindrical and dome shaped termination of the contacts to more ideally shape the electrical field and equipotential lines therebetween.

Laser diode triggered GaAs optoelectric switches require extremely high electric fields in the active bulk switch area. With proper GaAs, metal electrode, and dielectric design, a high bulk electric field can be achieved without carrier injection at the triple junction where the metal contacts, semiconductor, and a third medium conjoin. Carriers injected at this junction are easily avalanche multiplied in the high electric fields in the bulk material. Carrier generation and avalanche multiplication usually prevents the achievement of suitable high enough electric field for DC biased switch devices. The invention disclosed herein shows a design that prevents or eliminates carrier injection at the triple junction, and eliminates injected carrier multiplication by reducing the electric field along their travel path. Using the design proposed herein, DC biased devices can be fabricated with extremely high bulk electric fields, and very low triple junction fields that will not generate carriers.

The basic concept is to physically taper the GaAs from the high field semiconductor bulk area between the contacts to the triple junction circle around the periphery of the metallic contacts where the electrical field travels through differing dielectric media of metal, semiconductor, and epoxy or air. By such means, the electric field in the GaAs falls off almost exponentially as the triple junction is approached, especially in cylindrical geometry. With tapers between 20° and 35°, any desired electric field ratios between the central high field bulk area and the triple junction can be achieved. All triple junction carrier injection can be eliminated with electric fields that are 5% of the central field.

The tapered semiconductor is achieved by terminating the oppositely disposed cylindrical metal contacts with a flat and flared end, and building a domed extension emanating from each flared end at the desired 20° to 30° angle. The semiconductor is then cylindrically applied between each flared end around the periphery of and terminating at the base of each domed contact extension. By such means, any carriers generated in the tapered triple junction area or along the surface tend to follow the electric field lines and be kept away from the central, extreme field, switch area thereby avoiding streamers and electrical arcing from undesired carriers generated at the triple junction.

DETAILED DESCRIPTION OF THE INVENTION

Because the basic concept of the invention involves preventing or inhibiting carrier injection at a triple junction by physically tapering an optically active semiconductor between two electrodes from a high field area to a triple junction zone where the metal conductor conjoins with a Gallium Arsenide (GaAs) semiconductor and a third medium of yet another dielectric constant, the description herein will disclose at least four embodiments of the invention that each use a tapered GaAs medium as the optically active semiconductor between the two electrodes. It will be understood, however, that any suitable optically active medium would operate as well in place of GaAs and of course the invention is not limited to the embodiments disclosed in the specification.

Figure 1:
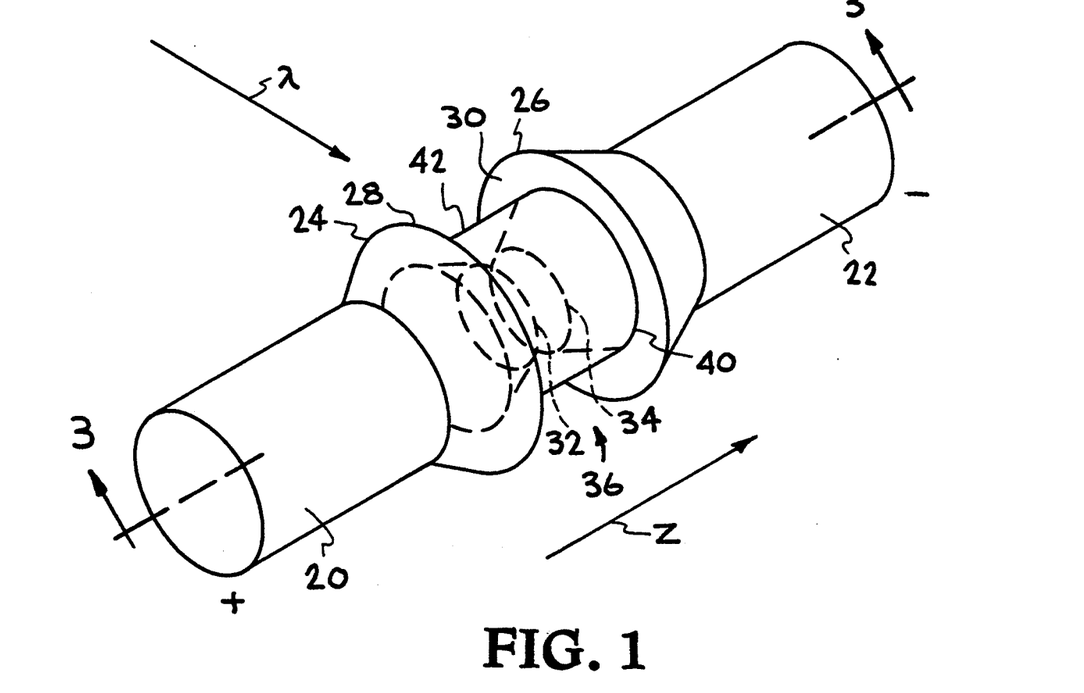
FIG. 1 illustrates a perspective view of a first embodiment of the invention.
Figure 3:
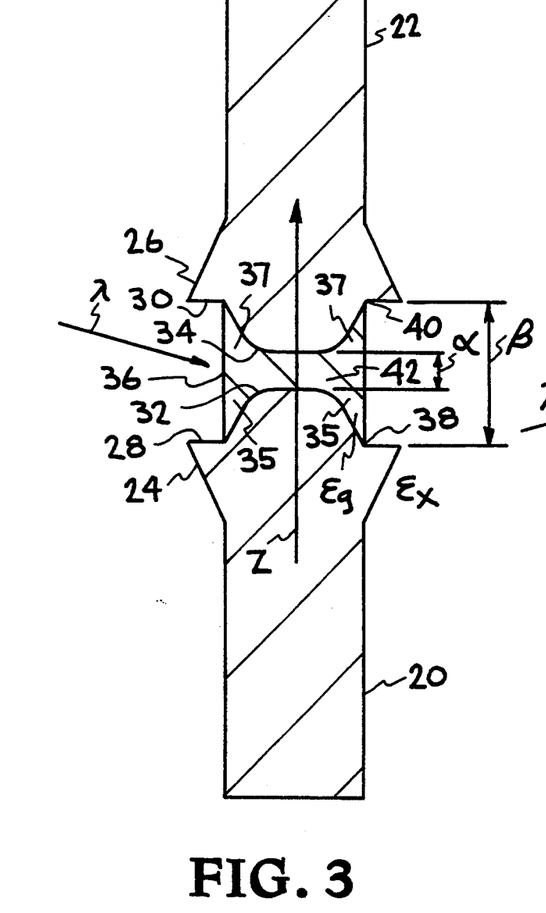
FIG. 3 illustrates a cross section of FIG. 1.

A basic and elementary embodiment of the invention is illustrated in the perspective view of FIG. 1 and cross section view thereof in FIG. 3, where first and second cylindrically shaped, metallic conductors (Kovar electrodes) 20 and 22 are disposed opposite to each other with each conductor having a flared termination 24 and 26 and flattened termination faces 28 and 30 parallel to each other. Termination faces 28 and 30 are separated by a distance, $\beta$, which in the preferred embodiment is 1 mm.

A pair of truncated ovoid contacts 32 and 34 extending from faces 28 and 30 with a 20° to 35° peripheral incline, depicted by dashed, hidden lines, extend toward each other from flattened termination faces 28 and 30, and are separated by a gap, $\alpha$, which in the preferred embodiment is 0.5 mm. A cylinder of GaAs 36 is Indium soldered to each Kovar electrode 20 and 22, encapsulating, surrounding, and terminating at the base of each truncated ovoid contact 32 and 34 forming tapered GaAs sections 35 and 37 leading to a triple junction zone or circle 38 and 40. At and around the triple junctions 38 and 40, electric lines of force experience different dielectric and metal media illustrated by dielectric constants $\epsilon_g$ for GaAs semiconductor and $\epsilon_x$ for a second dielectric medium which may be epoxy, air or other desired medium. The truncated ovoid contacts 32 and 34, each having a 20° to 3.5° incline, thereby impart a desired 20° to 30° taper to cylindrical GaAs medium 36 from a relatively thick bulk high density electric field area 42 across gap $\alpha$ to the tapered and relatively thin peripheral triple junction zones 38 and 40.

Figure 5:
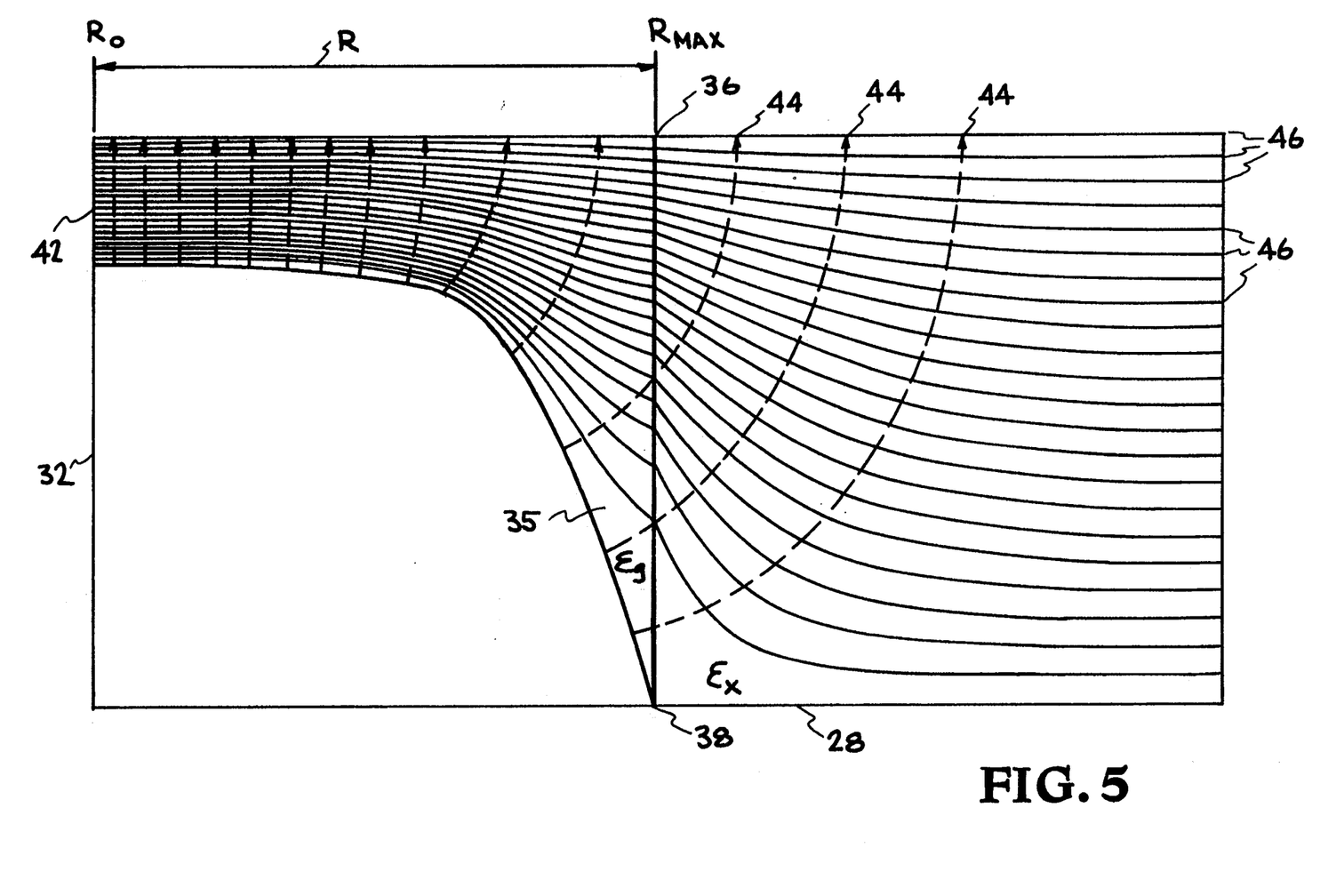
FIG. 5 is a pictorial representation of the electric field and equipotential lines emanating from one contact of the embodiment in FIG. 3.
Figure 7:
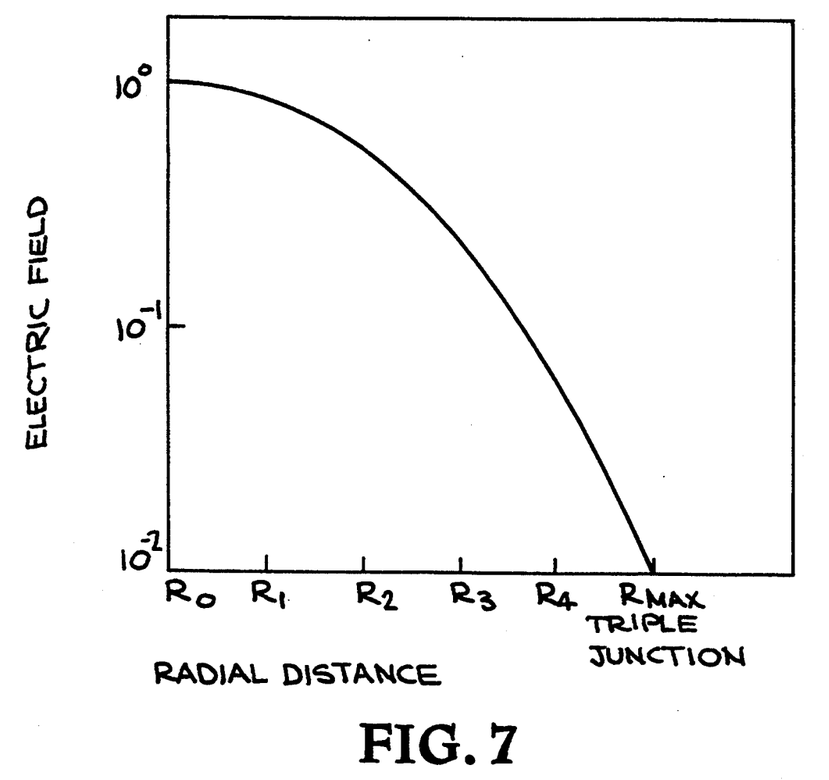
FIG. 7 is a graph indicating the exponential decrease in electric field radially from the center of a metal contact termination of FIG. 1.

Referring again to FIG. 3, the GaAs medium 36 normally acts as a resistive barrier between conductors 20 and 22; however, when illuminated by a laser beam, $\lambda$, many charge carriers are formed in the GaAs enabling conduction of current, l, through the semiconductor, and the medium switches from a resistor to a conductor. In FIG. 5, a graph of dashed electric field lines 44 and equipotential lines 46 of contact 32 indicate that primary conduction would take place in the bulk region 42 due to the heavy concentration of the electric field in that area. It should be noted that the dielectric constant for the GaAs medium 36 ($\epsilon_g$) is 12 and the dielectric constant for the outer, peripheral medium ($\epsilon_x$) is 3 in the illustration of FIG. 5. As indicated by the spacing of the first equipotential line from the electrode, the average field near the triple junction is 4% of the central field 42 in the bulk area. Therefore, little if any conduction or carrier generation takes place near the triple junction. The high density field of bulk area 42, however, enables the accumulation of a large charge carrier population from a relatively low laser illumination of the area, which in addition to promoting conduction, increases the sensitivity of the switch. FIG. 5 further indicates the substantial change in equipotential lines 46 as the triple junction zone 38 is approached; fewer electric lines of force exist and a greater spacing of equivalent equipotential lines arise. Due to a relatively low electric field in the triple junction area 38, charge carrier formation and injection into the bulk area 42 is inhibited. The electric field in the GaAs falls off almost exponentially as the triple junction 38 is approached, especially in the cylindrical geometry of FIGS. 1 and 2. FIG. 7 is a graph indicating how the electric field varies from the contact center radially outward to the triple junction area. It can be observed that the electric field is exponentially decreasing radially (R) from the center of contact 32 at $R_o$ to the triple junction 38 at $R_{max}$ as illustrated in FIG. 5.

Figure 2:
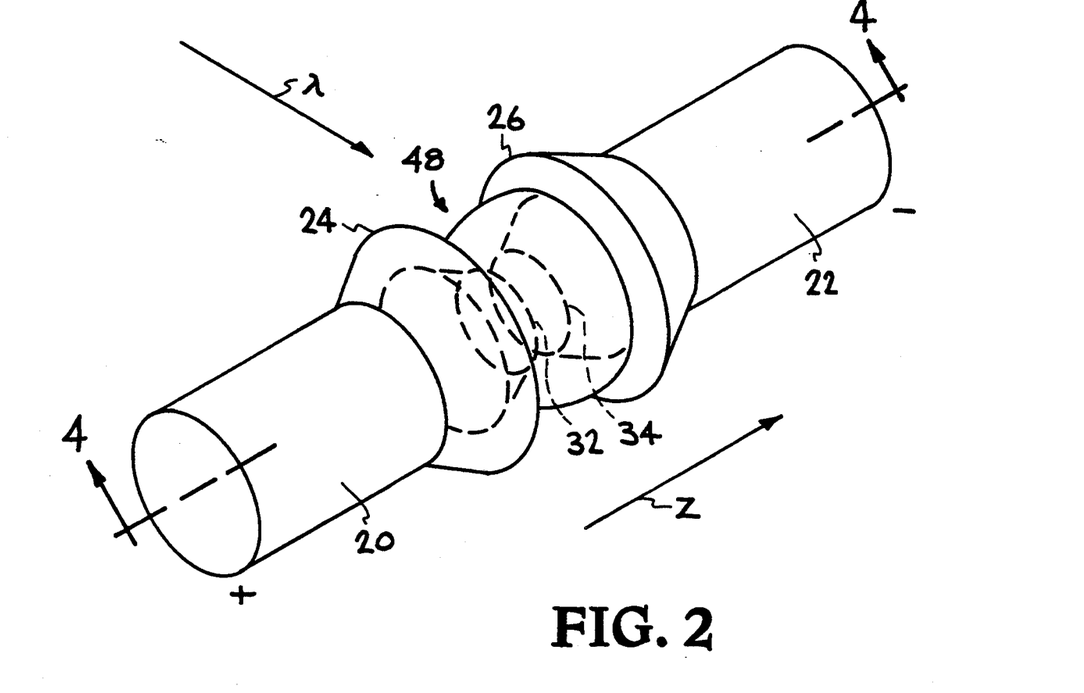
FIG. 2 illustrates a perspective view of a second embodiment of the invention.

Although the device of FIG. 1 is a substantial improvement in the art, it is not the best mode implementation of the novel switch device. The surface electric field along the GaAs-epoxy border, i.e. the differing dielectric interface, is not as uniform as it might be. The surface area carries a high electric field at the switch midplane between each contact, as illustrated in the close proximity of equipotential lines of FIG. 5, which increases the likelihood of carrier generation and avalanche carrier multiplication in that area. A modification of the simple version of FIG. 1 is illustrated in FIG. 2. FIG. 2 discloses a better configuration that can be designed to produce a uniform, minimum, surface electric field that can reduce the generation of carriers.

Figure 4:
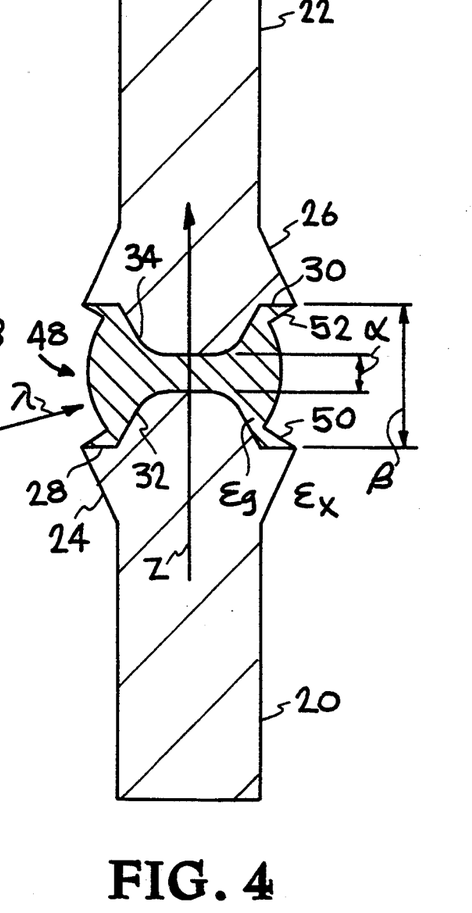
FIG. 4 illustrates a cross section of FIG. 2.
Figure 6:
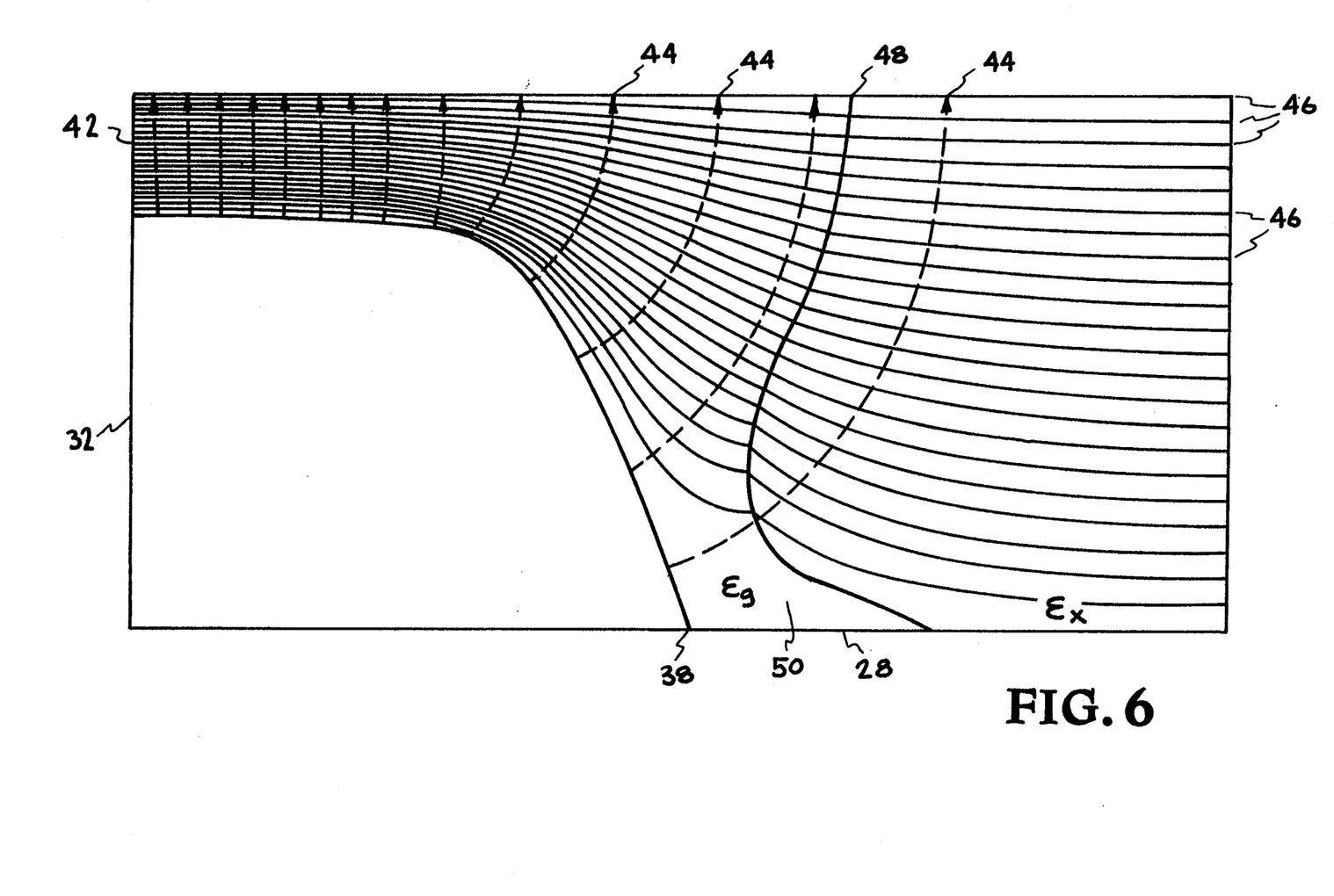
FIG. 6 is a pictorial representation of the electric field and equipotential lines emanating from one contact of the embodiment in FIG. 4.

As in FIGS. 1 and 3, the perspective view of FIG. 2 and cross section thereof in FIG. 4 in like manner illustrate first and second cylindrical, metallic Kovar electrodes 20 and 22 positioned opposite to each other with flared termination 24 and 26 having flattened termination faces 28 and 30 with truncated, ovoid protuberance contacts 32 and 34. In the modified embodiment of FIG. 2, the GaAs, optically active switching medium 48 coupling contacts 32 and 34 is cylindrically ovoid in shape to roughly parallel or follow the electric lines of force between contacts 32 and 34 as illustrated in FIG. 6. Indeed the 45° angled peripheral first and second footings 50 and 52 of ovoid cylinder 48 abutting flush with faces 28 and 30, respectively, further broadens and attenuates the effect of the triple junction. The outside shape of the GaAs semiconductor of FIGS. 2 and 4 is designed for a material that has purely resistive properties. The intrinsic GaAs used in these devices can be far different from this resistive property. The outside shape should be computer designed, taking into consideration the GaAs electrical properties, to give a configuration that minimizes peak GaAs surface electric fields.

Figure 8:
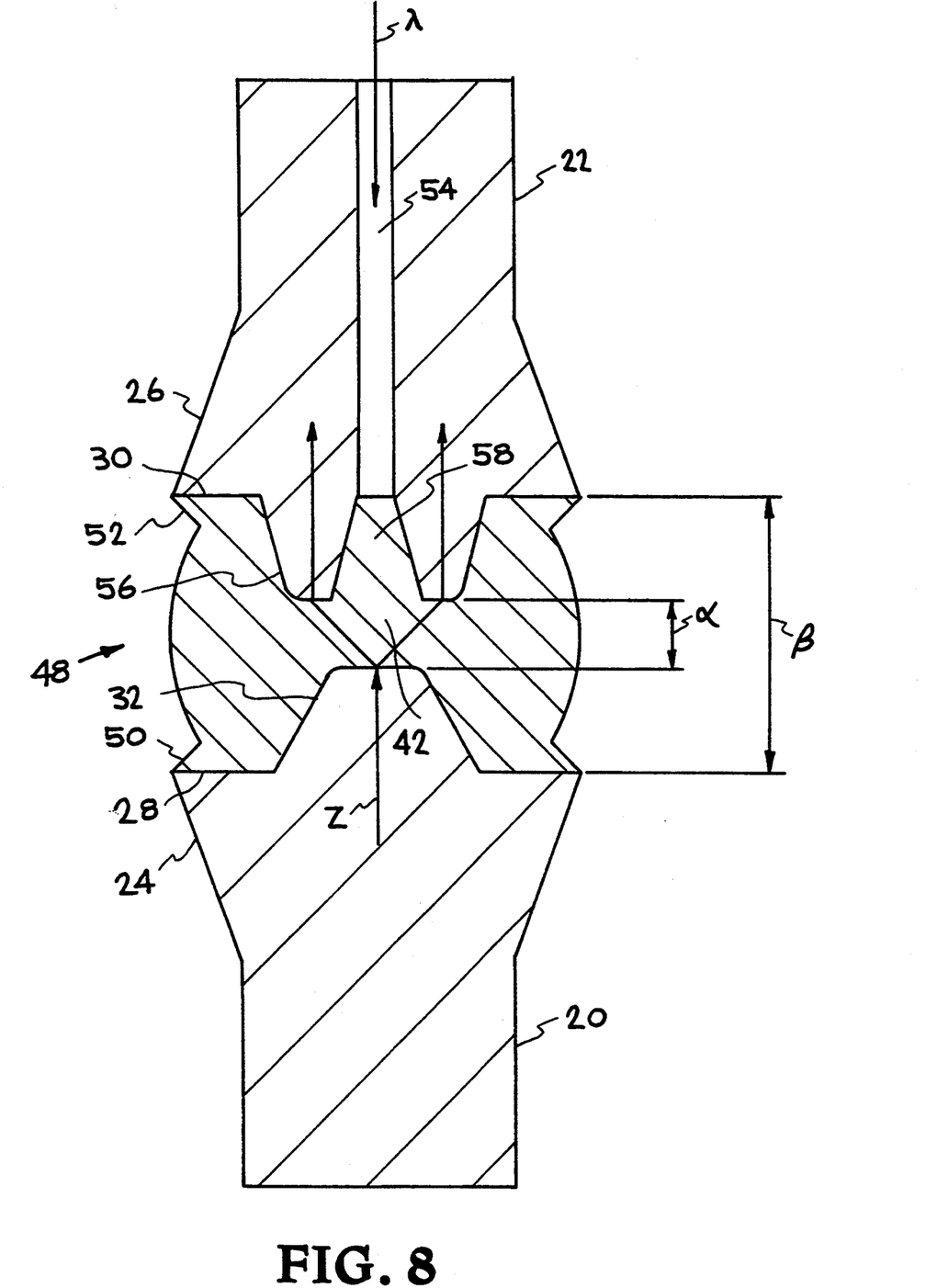
FIG. 8 illustrates a third embodiment in a cross section of a switch similar to FIG. 2 but with a different contact termination geometry wherein the illuminating radiation is centrally administered to the semiconductor through one of the contacts.

Referring now to FIG. 8, a cross section of a third embodiment of the invention is disclosed which is actually a modification of the cross section of FIG. 4. Whereas laser illumination, λ, is caused to fall upon the external surface of the ovoid semiconductor 48 in the embodiment of FIG. 4, the laser beam, λ, in the embodiment of FIG. 8 is caused to fall within the internal high density bulk area 42 of GaAs medium 48 via an internal and lengthwise laser channel 54 within conductor 22. All other aspects of the switch embodiment of FIG. 8 are similar to that of FIG. 4, with the exception, that truncated ovoid contact 56 of FIG. 8 is designed with a funnel bore 58 leading to laser, hollow channel 54. The GaAs semiconductor medium 48 is designed to come part way up laser bore 54 by filling funnel bore 58. The electric field falls off very rapidly in the GaAs within bore 58. Roughly the electric field drops a decade for each distance step equal to one radius of bore 58, which is yet a further electric field reduction by tapering the dielectric material.

The centrally triggered embodiment of FIG. 8 is designed for large GaAs switch designs because limited penetration of the infrared (IR) laser light in GaAs may limit the size of the GaAs switch that can be switched successfully with a single beam of IR radiation. Locating the IR light centrally in the GaAs Switch will allow increasing the diameter of the GaAs switch. The embodiment illustrated in FIG. 8 discloses a design that introduces the IR light close in to the high field switch area, and at the same time, provides a low triple junction electric field that prevents the generation of charge carriers. Centrally triggering a large GaAs device reduces the distance the IR light has to penetrate in the GaAs to reach the extreme electric field region.

Figure 9:
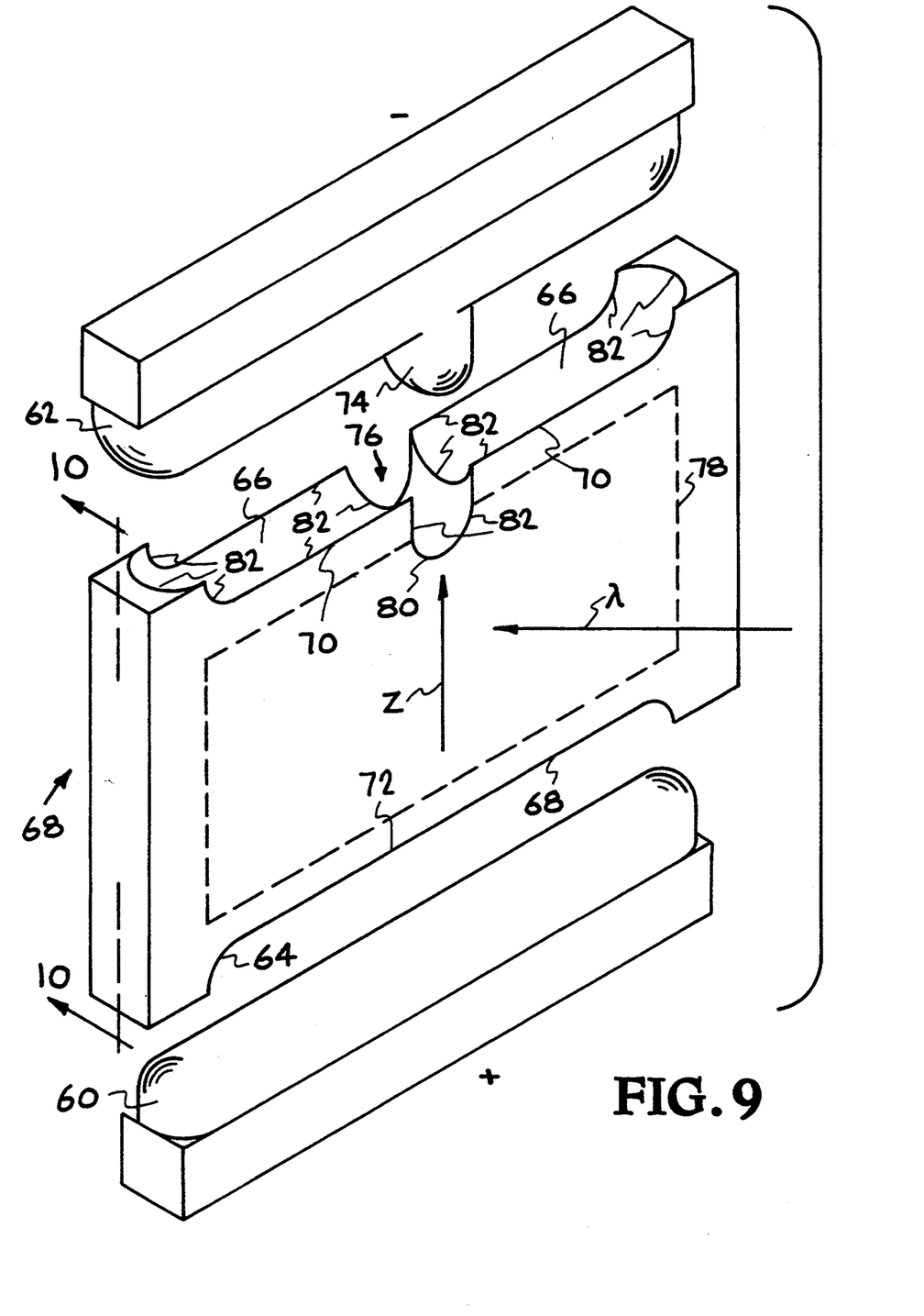
FIG. 9 illustrates a perspective view of a fourth embodiment of the invention wherein the interfacing semiconductor is flat with grooved contact faces as opposed to cylindrical versions of the previous embodiments.

Although the α and β gap measurements between electrodes in the three foregoing embodiments are roughly in the 0.5 mm and 1.0 mm range, these devices have been conceived with relatively small switch dimensions in mind such as would be convenient for use in a coaxial transmission line. For larger embodiments, such as the FIG. 8 variety, it will be appreciated that proportionate variations in semiconductor thickness and switch contact gaps may be made. In addition, although the foregoing embodiments all conceive a preferred and more advantageous cylindrical electrode-semiconductor geometry, the fourth embodiment illustrated in FIG. 9 depicts a perspective of a rectangular slab of GaAs that may be utilized in a rectangular electrode environment. By designing curved metal contact surfaces of first and second rectangular electrodes 60 and 62 oriented to snugly fit within similarly curved receptor sides 64 and 66 of a GaAs slab 68, a tapering effect is again achieved to control the electric field at a rectangular slab triple junction 70 and 72. Indeed an oval shaped projection 74 of second rectangular contact 62 is configured to fit within a similar oval shaped slot 76 adding yet another curved and tapering surface 80 and effect on the GaAs slab 68 and in addition acts as a probe for insertion into the laser, λ, illuminated area delineated by dashed line 78. When illuminated by laser light, λ, charge carriers are formed which again changes GaAs slab 68 from a resistive barrier to a conductor permitting current flow, 1, from contact 60 to contact 62. It is further envisioned that illuminated area 78 could be controlled by bonding an IR absorbing dielectric to the GaAs which will function as a collimator. Bonding would also control edge chipping of the GaAs in the lapping process.

Although the fourth embodiment of the invention illustrated in FIG. 9 depicts a right rectangular prism, it is envisioned that other solids may be used as well as, polyhedrons in general (solids whose sides are polygons) and prisms (polyhedrons with congruent and parallel polygons as bases and parallelograms as sides).

Figure 10:
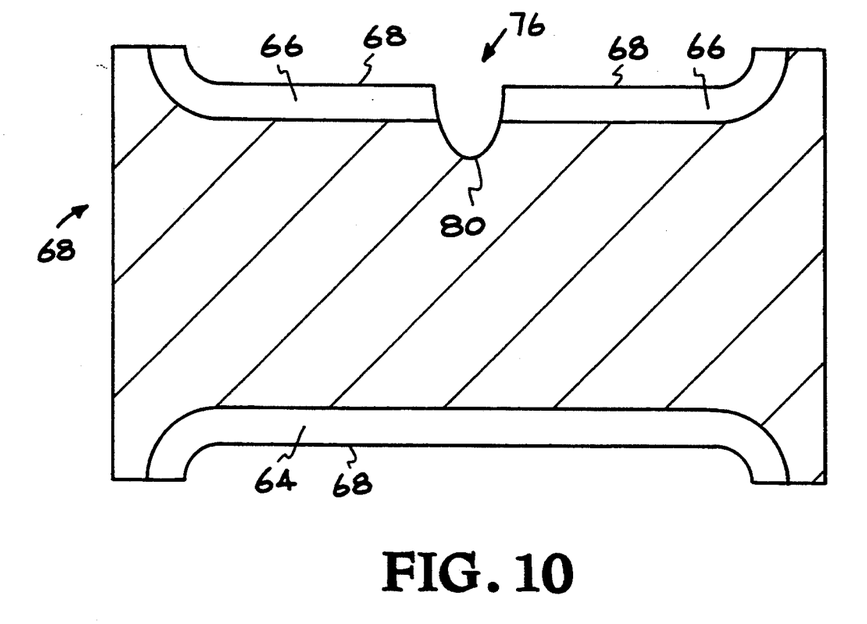
FIG. 10 illustrates a cross section of FIG. 9.

FIG. 10 is provided as a cross section of FIG. 9 to more completely illustrate the grooved receptacles 64 and 66 on either side of GaAs semiconductor slab 68. The tapered triple junction oval indent 80 and triple junction groove lines 82 of slab 68 are more clearly indicated in FIG. 10 than is apparent in FIG. 9.

What is claimed is:

1. An optoelectric switch comprising:
   at least two conductor electrodes,
   an optically active dielectric medium disposed between and coupling said at least two conductor electrodes, said dielectric medium having a bulk field area and a tapered interface with said at least two conductor electrodes.

2. An optoelectric switch according to claim 1, wherein at least one said conductor electrode is cylindrically shaped.

3. An optoelectric switch according to claim 2, wherein said cylindrically shaped electrode has a flared termination with a flattened face oppositely disposed to an opposing electrode.

4. An optoelectric switch according to claim 3, wherein said electrode flattened face is provided with an ovoid protuberance extending from said flattened face toward an opposing electrode.

5. An optoelectric switch according to claim 4, wherein said ovoid protuberance is truncated.

6. An optoelectric switch according to claim 5, wherein said electrodes are Kovar electrodes.

7. An optoelectric switch according to claim 1, wherein said optically active first dielectric medium is a semiconductor.

8. An optoelectric switch according to claim 7, wherein said semiconductor is Gallium Arsenide (GaAs).

9. An optoelectric switch according to claim 8, wherein said GaAs is cylindrically shaped.

10. An optoelectric switch according to claim 8, wherein said GaAs is ovoid shaped in such manner that the curved surface thereof roughly parallels the curved electric lines of force passing therethrough.

11. An optoelectric switch according to claim 8, wherein said GaAs is a polyhedron.

12. An optoelectric switch according to claim 11, wherein said polyhedron is a prism.

13. An optoelectric switch according to claim 12, wherein said prism is a rectangular prism.

14. An optoelectric switch according to claim 13, wherein said rectangular prism is a right rectangular prism.

15. An optoelectric switch according to claim 14, wherein said prism is provided with grooved conductor receptor slots on at least one side thereof.

16. An optoelectric switch according to claim 15, wherein at least one of said receptor slots is provided with an oval conductor receptor indent protruding into said bulk field area.

17. An optoelectric switch according to claim 1, wherein at least one of said conductors is provided with a hollow channel passing lengthwise therethrough.

18. In an optoelectric switch consisting of an optically active first dielectric medium disposed between and coupling two electrodes together with a second dielectric medium conjoined at a triple junction of at least one said electrode, said first dielectric medium, and said second dielectric medium, the improvement comprising:
    coupling said electrodes with a cylinder of said optically active first dielectric medium;
    internally tapering said optically active first dielectric cylinder from a broad domain in a central bulk field area of said cylinder to a thin circular peripheral area around either end of said cylinder on said electrode at said triple junction; and
    curving the sides of said cylinder in a convex and ovoid manner to cause the exterior wall of said cylinder to roughly parallel the electric field flowing therethrough.

* * * * *